United States Patent
Minobe

(10) Patent No.: US 7,583,210 B2
(45) Date of Patent: Sep. 1, 2009

(54) DIFFERENTIAL OFFSET CORRECTION CIRCUIT

(75) Inventor: Kenichi Minobe, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/902,700

(22) Filed: Sep. 25, 2007

(65) Prior Publication Data

US 2008/0079616 A1 Apr. 3, 2008

(30) Foreign Application Priority Data

Sep. 28, 2006 (JP) ............................. 2006-265601

(51) Int. Cl.
*H03M 1/06* (2006.01)
(52) U.S. Cl. ...................................... 341/118; 341/144
(58) Field of Classification Search ................. 341/118, 341/144, 147, 143; 330/9
See application file for complete search history.

(56) References Cited

U.S. PATENT DOCUMENTS

| | | | |
|---|---|---|---|
| 4,229,703 A * | 10/1980 | Bustin ........................ 327/307 |
| 5,153,592 A | 10/1992 | Fairchild et al. |
| 5,355,058 A * | 10/1994 | Jackson et al. ............... 315/371 |
| 5,731,772 A * | 3/1998 | Mikkola et al. ............. 341/118 |
| 6,313,776 B1 | 11/2001 | Brown |
| 7,081,785 B2 * | 7/2006 | Mori et al. ................... 327/307 |
| 2001/0048344 A1* | 12/2001 | Isken et al. ..................... 330/9 |
| 2006/0007029 A1 | 1/2006 | Ito |

FOREIGN PATENT DOCUMENTS

JP A-HO7-030596 1/1995

OTHER PUBLICATIONS

Tan Khen-Sang et al.; Error Correction Techniques for High-Performance Differential A/D Converters; IEEE Journal of Solid-State Circuits 25; Dec. 1990; vol. 25; No. 6; New York; U.S.; p. 1318-1327.

* cited by examiner

*Primary Examiner*—Brian Young
(74) *Attorney, Agent, or Firm*—Fujitsu Patent Center

(57) ABSTRACT

An analog-to-digital converter conventionally performing a detection of a differential offset is replaced by a comparator 20. A reference voltage is input to a terminal on one side of the comparator 20 and each of a pair of differentials of a differential voltage signal is input to the other terminal one by one. Then, a setup of voltages of both of the pair of differentials to closer values to the reference voltage makes both voltages of the pair of differentials eventually the same, thereby making it possible to correct a differential offset.

3 Claims, 5 Drawing Sheets

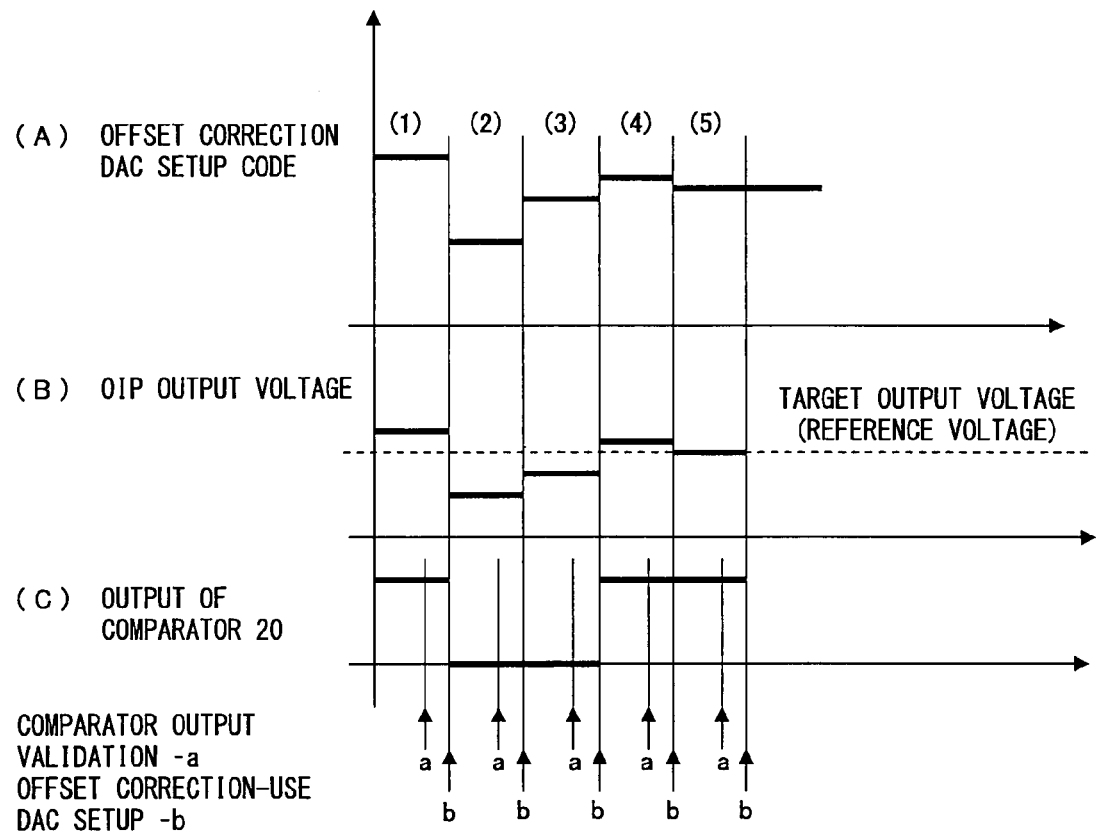
F I G. 3

DIFFERENTIAL OFFSET CORRECTION CIRCUIT

CROSS-REFERENCE TO RELATED APPLICATIONS

This application is based upon and claims the benefit of priority from the prior Japanese Patent Application No. 2006-265601 filed on Sept. 28, 2006, the entire contents of which are incorporated herein by reference.

BACKGROUND OF THE INVENTION

1. Field of the Invention

The present invention relates to a circuit for correcting a differential offset of a transmission apparatus sending out a transmission signal of a telecommunication system.

2. Description of the Related Art

When using a quadrature modulation such as a binary phase shift keying (BPSK)/quadrature phase shift keying (QPSK) and such in a digital wireless technique, a differential offset amount of a transmission output circuit inputting a transmission signal as a differential signal to a quadrature modulator has a great deal of influence to a transmission performance. Therefore, the conventional technique feeds back a voltage of a differential output signal of a transmission output circuit, applies an analog/digital (AD) conversion and obtains a value of the output voltage, thereby correcting the differential offset based on the obtained value.

FIG. 1 is a diagram exemplifying a configuration of a conventional differential offset correction circuit.

A transmission digital signal generated at a transmission digital signal generation unit 10 is input to a primary signal differential output digital/analog converter (DAC) 12 of a transmission analog signal output unit 11-1. The transmission analog signal output unit 11-1 corresponds to an I channel-use when performing a quadrature modulation. When performing a quadrature modulation, it is also equipped in a Q channel-use transmission analog signal output unit 11-2. The configuration of the transmission analog signal output unit 11-2 is the same as that of the transmission analog signal output unit 11-1 and therefore the drawing thereof is omitted herein.

The primary signal differential output DAC 12 outputs a primary signal that is a digital signal as an analog difference voltage signal. The difference voltage signal output from the primary signal differential output DAC 12 is amplified by a fully differential amplifier 13. Respective signals of the differential voltage signal are input to a voltage value adjustment circuit comprising resistors R1 and R2 and a differential amplifier 14-1, and resistors R3 and R4 and a differential amplifier 14-2, followed by being set at a prescribed voltage and being output by way of an output control switch 15. The output voltages are indicated by the OIP on one side and by the OIM on the other. Because it is a differential voltage signal, the quadrature modulator is operated on the basis of the voltage difference between the OIP and OIM if an output signal is given to the quadrature modulator. Therefore, if there is a differential offset in the differential voltage signals OIP and PIM, the operation of the quadrature modulator is adversely influenced. This accordingly requires a control of the voltage values of the OIP and OIM by controlling the differential amplifiers 14-1 and 14-2.

The conventional technique shown in FIG. 1 is configured to input the outputs of the differential amplifiers 14-1 and 14-2 respectively to an offset detection-use AD converter (ADC) 17 by way of a comparator input select switch 16. The offset detection-use ADC 17 is an AD converter for converting the differential offset value of the analog differential voltage signal output from the differential amplifiers 14-1 and 14-2. The output of the offset detection-use ADC 17 is input to a control logic unit 18 which then inputs a reference voltage value, as a digital value, to the offset correction-use DAC 19-1 and 19-2, so as to minimize a differential offset amount as much as possible. The offset correction-use DACs 19-1 and 19-2 convert the digital voltage value obtained from the control logic unit 18 into analog voltage values and input to the respective terminals, on one side, of the differential amplifiers 14-1 and 14-2, respectively, as a reference voltage. Such an operation results in the reference voltage which is input to the differential amplifiers 14-1 and 14-2 being adjusted so as to minimize the differential offset, and therefore the voltage values of the differential voltage signal output from the differential amplifiers 14-1 and 14-2 are adjusted so as to minimize the differential offset.

As another conventional technique for reducing an adverse effect of a differential offset, there is one noted in a reference patent document 1, in which a method for adding correction data to transmission data in order to remove an adverse effect of a differential offset.

Patent document 1: Laid-Open Japanese Patent Application Publication No. H07-30596

In the case of the conventional technique shown in FIG. 1, there are various methods of an AD converter (i.e., the offset detection-use ADC 17), such as a consecutive conversion type, flash type, et cetera, in which a circuit area size, hence consumption current, generally increases with conversion speed. And, if a highly accurate offset adjustment is required, a minute adjustment is necessary after a correction because an error at an AD conversion and errors of a correction-use DAC (i.e., offset correction-use DAC 19-1 and 19-2) are accumulated.

SUMMARY OF THE INVENTION

According to an aspect of an embodiment, a differential offset correction circuit comprising: a differential digital-to-analog conversion unit for converting a digital signal into differential analog signals; a comparator for detecting the differential analog signals; and a differential offset correction unit for correcting a differential offset based on the detection result of the comparator.

The present invention is contrived not to use an AD converter for detecting a differential offset, thereby making it possible to make a circuit area size and power consumption small, and also correct the differential offset highly accurately.

BRIEF DESCRIPTION OF THE DRAWINGS

FIG. 3 is a diagram describing an operation of a control logic unit;

DESCRIPTION OF THE PREFERRED EMBODIMENTS

Figure 2:
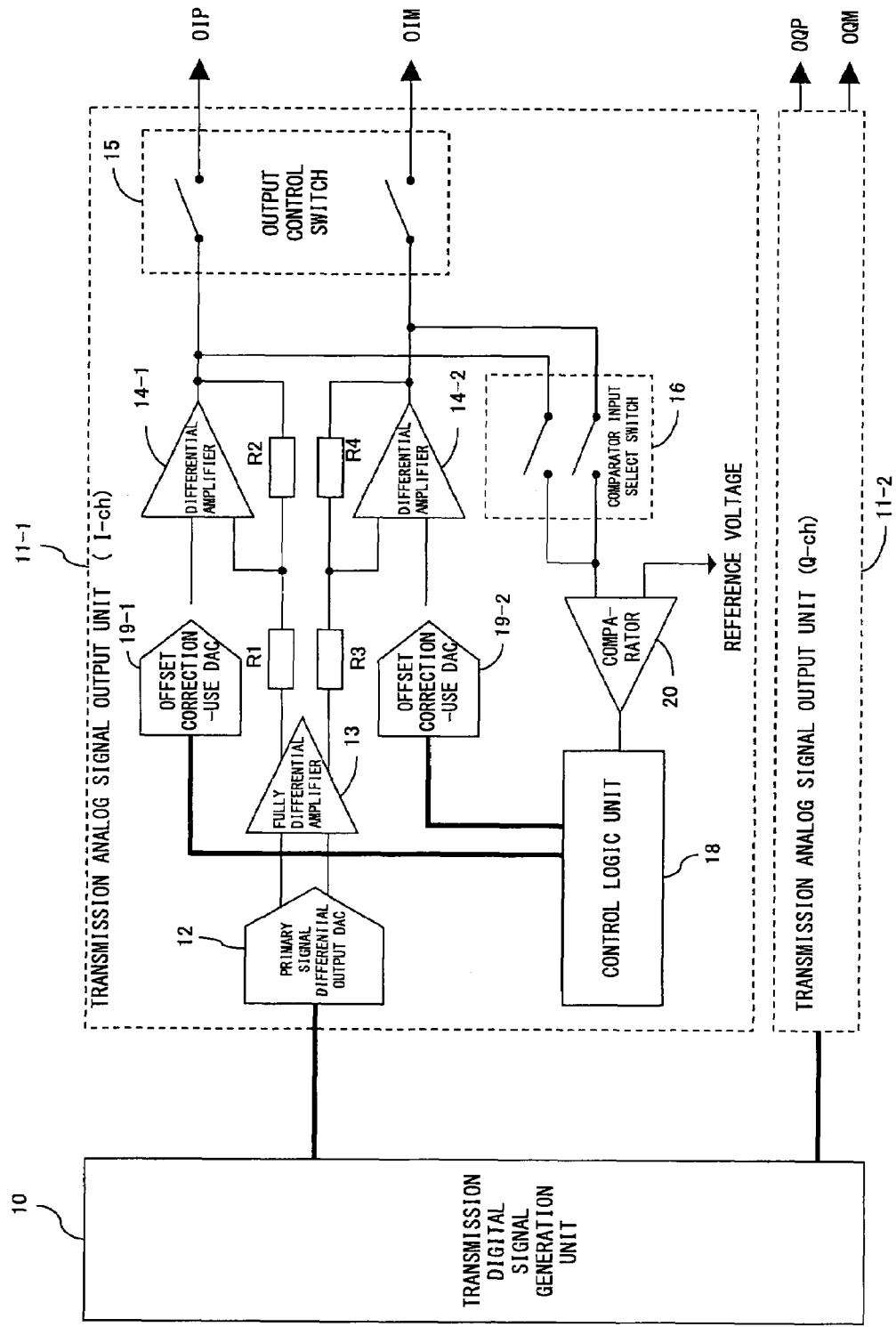
FIG. 2 is a diagram exemplifying a configuration of a differential offset correction circuit according to a first embodiment of the present invention.

FIG. 2 is a diagram exemplifying a configuration of a differential offset correction circuit according to a first embodiment of the present invention.

Figure 1:
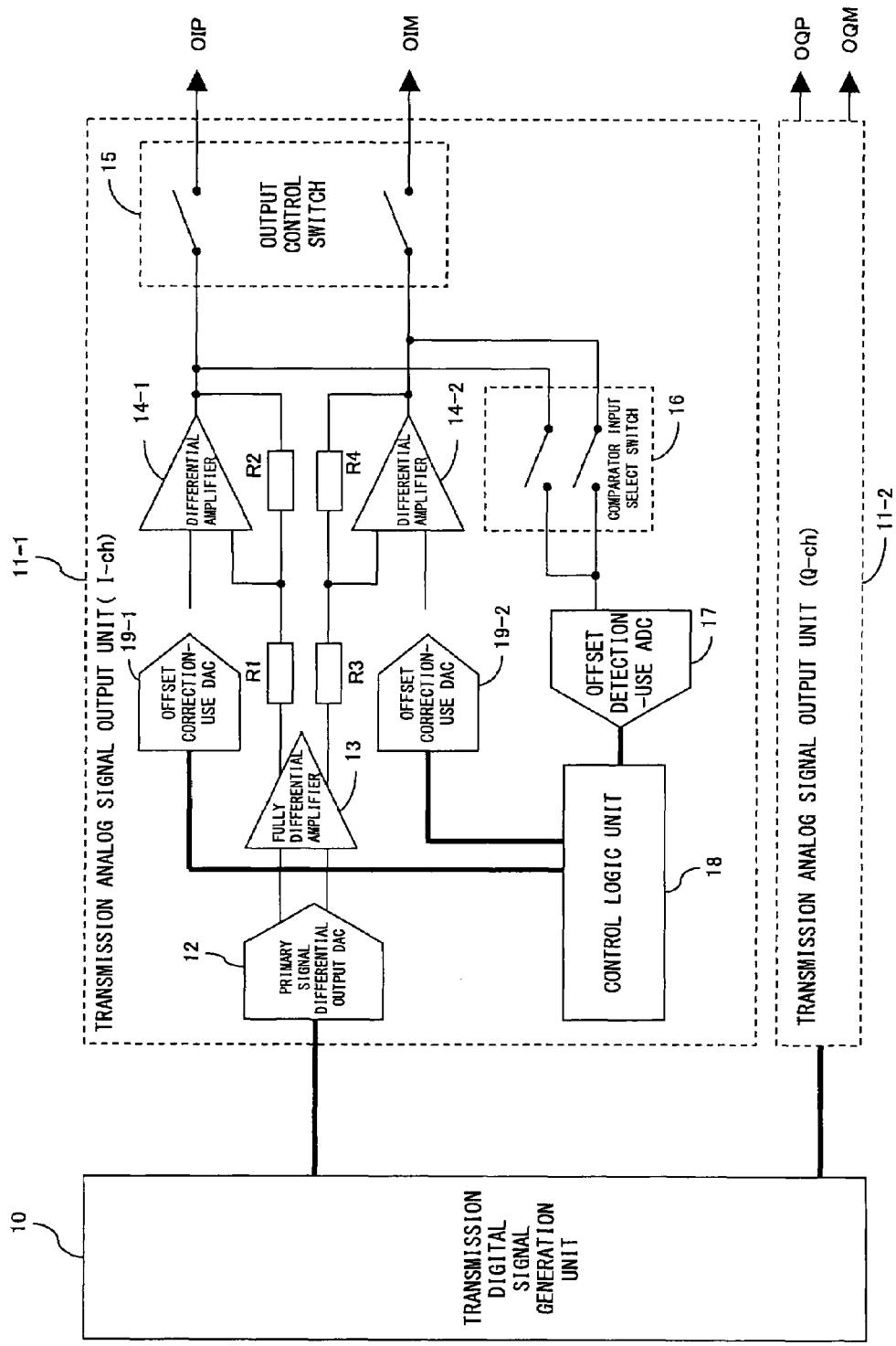
FIG. 1 is a diagram exemplifying a configuration of a conventional differential offset correction circuit.

In the showing of FIG. 2, the same component number is assigned to the same constituent component as that of FIG. 1 and it is briefly described.

In a common operation, a digital signal generated at a transmission digital signal generation unit 10 is digital-to-analog (DA)-converted at a primary signal differential output DAC 12 of transmission analog signal output units 11-1 and 11-2 and an analog signals is output. A differential offset defined as a problem here refers to a signal output from the transmission digital signal generation unit 10 being a voltage between the OIP and OIM (or between the OQP and OQM) in the state of the aforementioned signal being absent. In order to make the voltage between the OIP and OIM close to zero ("0"), a comparator 20 is equipped for detecting the voltage across the OIP and OIM. A reference voltage and a voltage of the OIP (or OIM) terminal are input to the comparator 20, and the comparison result is input to a control logic unit 18 as a digital signal.

A comparator input select switch 16 of the comparator 20 is switched over by the control logic unit 18. A closure of one switch of the two at a time compares the voltage of the OIP, or OIM, with the reference voltage, for either one at a time. Based on the comparison result of the comparator 20, the control logic unit 18 changes a digital value (i.e., a setup code) to be given to each of offset correction-use DACs 19-1 and 19-2. A repetition of the comparison by the comparator 20 and a setup of the offset correction-use DACs 19-1 and 19-2 based on the comparison result makes it possible to obtain an output voltage close to the reference voltage. Then, an execution of the same work on each terminal of the OIP and OIM with the two switches of the comparator input select switch 16 being closed in sequence makes it possible to make a differential offset amount approximately close to zero ("0").

The comparator 20 usually possesses a self-offset, sometimes resulting in the output value of the comparator 20 being "0" even if the input and output voltages are not truly identical when they are compared with each other. The adjustment of the voltages of the OIP and OIM, respectively, as a result of comparing them with the reference voltage, respectively, makes the differential offset between the OIP and OIM nearly zero ("0") even in the case of the comparator 20 setting an output value at "0" when the input voltage is higher than the reference voltage by "A" millivolts for example because both of the voltages of OIP and OIM are set at "A" millivolts higher than the reference voltage.

An output control switch 15 has the function of cutting off a line to an outside so as to prevent a voltage value of the differential amplifiers 14-1 and 14-2 during an adjustment of a differential offset. During the adjustment of a differential offset, the output voltages of the differential amplifiers 14-1 and 14-2 vary, and therefore, if the voltages are input to a circuit such as a quadrature modulator connected to the OIP and OIM terminals, the circuit is adversely affected. An avoidance of such problem is the purpose of the aforementioned function.

As such, a large scale circuit such as an AD converter has conventionally been required for correcting a differential offset; a preferred embodiment of the present invention, however, is configured to replace it with a single comparator, thereby enabling a large reduction of a circuit scale and also an accurate correction of a differential offset.

FIG. 3 is a diagram describing an operation of the control logic unit.

To begin with, the assumption is that the OIP output voltage is higher than the target output voltage (i.e., the reference voltage) at the initial point in time (1), as shown in (B). Also assumed is that the offset correction DAC setup code is (A) and that the output of the comparator 20 is (C) in this event. The control logic unit 18 validates the output value of the comparator at the point of "a" in time and sets the offset correction-use DAC at the point of "b" in time. Assuming that the value of the offset correction DAC setup code is "B" at the point of (1), the output voltage of the OIP is apparently larger than the target output voltage, and therefore the next offset correction DAC code (i.e., a digital value) is defined as B−B/2. By this, the OIP output voltage becomes smaller as shown in (2). Validating the comparison value of the comparator 20 at the point (1), an OIP output voltage has apparently become the target output voltage, and therefore the control logic unit 18 sets an offset correction DAC setup code at B−B/2+B/4. Then, an OIP output voltage increases a little as shown in (3). Yet the OIP output voltage is lower than the target output voltage, and the control logic unit 18 accordingly sets an offset correction DAC setup code at B−B/2+B/4+B/8. Then, the OIP output voltage increases to become a little higher than the target output voltage as shown in (4). Now that the OIP output voltage is higher than the target output voltage, the control logic unit 18 sets an offset correction DAC setup code at B−B/2+B/4+B/8−B/16. This apparently makes the OIP output voltage approximately at the target output voltage as shown in (5).

As described above, the control logic unit 18 gives a correction value of $B/2^n$ to a setup code in the nth control where the B is defined as an offset correction DAC setup code at the time of starting the control operation. Whether a correction value is positive or negative is determined in a manner that it is negative if an OIP output voltage indicates higher than the target output voltage, and that it is positive if it is vice-versa. The number of controls "n" is n=N−1 where the N is defined as the number of bits of an offset correction DAC setup code.

A control of the above described for the OIM sets both of the OIP and OIM at a value close to the reference voltage, thereby making it possible to make the differential offset at nearly zero.

Figure 4:
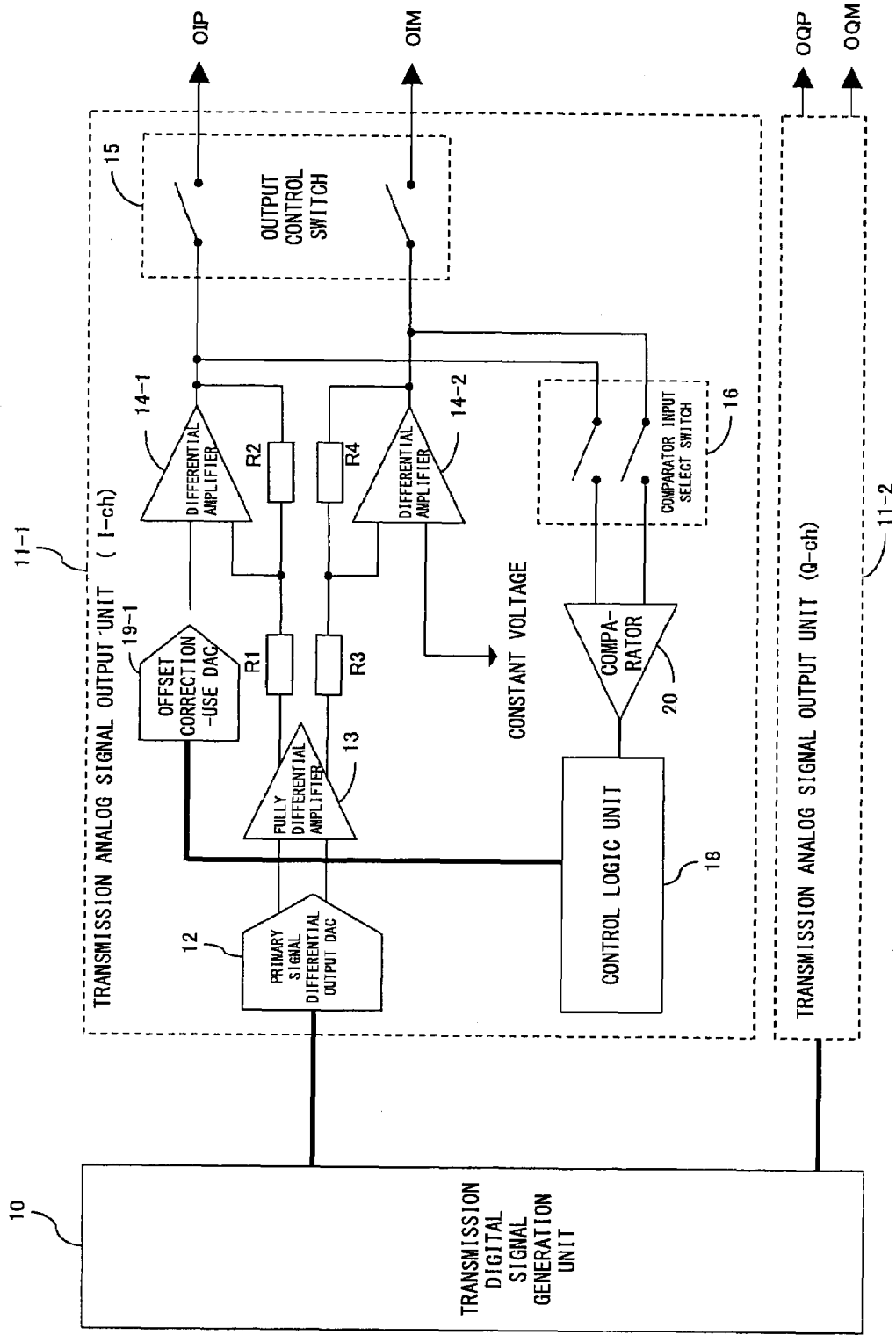
FIG. 4 is a diagram exemplifying a configuration of a differential offset correction circuit according to a second embodiment of the present invention.

FIG. 4 is a diagram exemplifying a configuration of a differential offset correction circuit according to a second embodiment of the present invention.

In the showing of FIG. 4, the same component number is assigned to the same constituent component as that of FIG. 2 and the description is omitted here.

In the configuration of FIG. 4, an offset correction-use DAC 19-1 is equipped only on the OIP side. A constant voltage is input to a differential amplifier 14-2, and an output voltage value on the OIM side is set at a certain value. And, a reference voltage is not input to a comparator 20, and instead an output voltage of the OIP side and that of the OIM side are input to the comparator 20. This configuration aims at adjusting an output voltage value of the OIP side by using the output voltage of the OIM side as reference. Since the comparator 20 contains an error as described above, there may be a case of the output voltage of the OIP side being not identical with that of the OIM side. If the difference between the output voltage of the OIP side and that of the OIM side is within the allowable range of a circuit connected to the OIP and OIM terminals, however, the present configuration is also applicable. In this case, since there is no need of an offset correction-use DAC on the OIM side, a circuit scale can be small; and since there is no need to set the OIP side and OIM side in sequence, a benefit of a faster operation is obtained.

The comparator input select switch may merely be configured in a manner to close during an operation of correcting a differential offset and open during a normal operation.

An operation of the control logic unit 18 is similar to that of the first embodiment.

Figure 5:
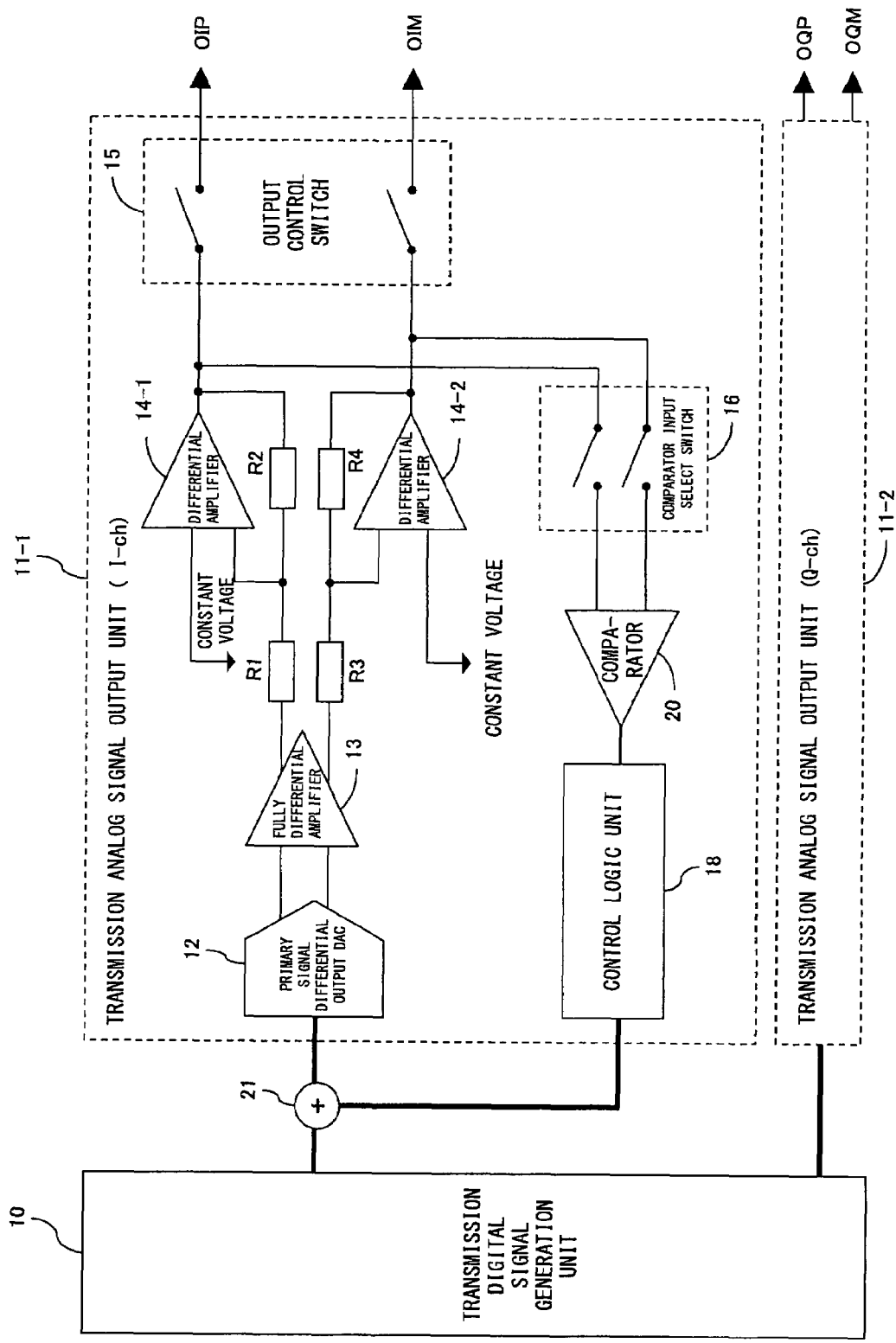
FIG. 5 is a diagram exemplifying a configuration of a differential offset correction circuit according to a third embodiment of the present invention.

FIG. 5 is a diagram exemplifying a configuration of a differential offset correction circuit according to a third embodiment of the present invention.

In the showing of FIG. 5, the same component number is assigned to the same constituent component as that of FIG. 2 and the description is omitted here.

In the configuration of FIG. 5 an offset correction-use DAC is eliminated and a constant voltage is input to differential amplifiers 14-1 and 14-2. A correction of a differential offset is carried out by outputting an offset correction-use digital value output from a control logic unit 18 and adding it to a primary signal of a transmission digital signal generation unit 10 by using an adder 21. That is, a normal operation of a primary signal differential output DAC 12 is to output a zero volt as a differential voltage when a value of a digital primary signal of a prescribed number of bits is a half of the maximum value expressed by the aforementioned number of bits. If there is a differential offset, however, an input digital primary signal value at the time of outputting a zero volt as differential voltage is a value displaced from the half of the maximum value expressed by the number of bits of the primary signal. Therefore, it is possible to correct a differential offset by applying a correction to the primary signal for the displaced amount by using a digital value from the control logic unit 18. The method for the correction is basically the same as the case described in FIG. 3, which gives a correction, to a digital value of the primary signal, by a large number at the beginning, followed by a smaller number as gradually proceeding with the number of times of controls so as to converge the control.

What is claimed is:

1. A differential offset correction circuit comprising:
   a differential digital-to-analog conversion unit to convert a digital signal into a differential analog signal;
   a comparator to detect the differential analog signal; and
   a differential offset correction unit to correct a differential offset based on the detection result of the comparator, wherein
   the comparator compares each of a pair of differentials of the differential analog signal with a reference voltage and generates a detection result based on the difference between each voltage of the pair of differentials and reference value, and
   the differential offset correction unit makes each voltage value of the pair of differentials close to the reference voltage value based on the detection result, thereby correcting a differential offset, and
   the differential offset correction unit includes a control logic unit, and two sets of digital-to-analog converters and differential amplifiers.

2. A differential offset correction circuit comprising:
   a differential digital-to-analog conversion unit to convert a digital signal into a differential analog signal;
   a comparator to detect the differential analog signal; and
   a differential offset correction unit to correct a differential offset based on the detection result of the comparator, wherein
   a voltage of a pair of differentials on one side of the differential analog signal are fixed,
   the comparator generates a detection result based on the difference between the fixed voltage value of one side of the pair of differentials and the voltage value of the other side of the pair of differentials, and
   the differential offset correction unit makes the voltage value of one side of the pair of differentials close to the voltage value of the other side thereof on the basis of the detection result, thereby correcting a differential offset, and
   the differential offset correction unit includes a control logic unit, one set of digital-to-analog converter and differential amplifier, and a second differential amplifier.

3. A differential offset correction circuit comprising:
   a differential digital-to-analog conversion unit to convert a digital signal into a differential analog signal;
   a comparator to detect the differential analog signal; and
   a differential offset correction unit to correct a differential offset based on the detection result of the comparator, wherein
   the comparator generates a detection result based on the difference of voltages of a pair of differentials of a differential analog signal, and
   the differential offset correction unit gives a correction value to a digital signal given to the differential digital-to-analog conversion unit, thereby correcting a differential offset, and
   the differential offset correction unit includes a control logic unit, a first differential amplifier and a second differential amplifier.

* * * * *